United States Patent [19]
Fukazawa

[11] Patent Number: 5,442,236
[45] Date of Patent: Aug. 15, 1995

[54] SEMICONDUCTOR DEVICE HAVING A MULTILAYERED WIRING STRUCTURE WITH DUMMY WIRING

[75] Inventor: Yuji Fukazawa, Yokohama, Japan

[73] Assignee: Kabushiki Kaisha Toshiba, Kawasaki, Japan

[21] Appl. No.: 372,857

[22] Filed: Jan. 13, 1995

Related U.S. Application Data

[63] Continuation of Ser. No. 30,619, Mar. 12, 1993, abandoned.

[30] Foreign Application Priority Data

Mar. 14, 1992 [JP] Japan .................. 4-089591
Mar. 11, 1993 [JP] Japan .................. 5-077697

[51] Int. Cl.⁶ ............. H01L 23/48; H01L 29/46; H01L 29/54; H01L 29/62
[52] U.S. Cl. ............. 257/758; 257/759; 257/774; 257/773; 257/779
[58] Field of Search ............ 257/666, 758, 759, 773, 257/774, 779, 794

[56] References Cited

U.S. PATENT DOCUMENTS

| | | | |
|---|---|---|---|
| 3,323,198 | 6/1967 | Shortes | 257/758 |
| 4,866,009 | 9/1989 | Matsuda . | |
| 5,027,188 | 6/1991 | Owada et al. | 257/773 |
| 5,091,768 | 2/1992 | Yamazaki | 257/774 |
| 5,117,280 | 5/1992 | Adachi | 257/793 |

FOREIGN PATENT DOCUMENTS

63-127551 5/1988 Japan .

*Primary Examiner*—Sara W. Crane
*Assistant Examiner*—Carl Whitehead, Jr.
*Attorney, Agent, or Firm*—Finnegan, Henderson, Farabow, Garrett & Dunner

[57] ABSTRACT

The present invention is characterized in that a dummy wiring is provided between wirings constituting a multi-layered wiring, when an electric connection is prepared between wirings disposed in the vertical direction. The dummy wiring is exposed to the contact hole of the insulating film which is filled by the connection wiring. Therefore, the dummy and multi-layered wiring serve as growth seeds in the contact hole, and tungsten beings selective growth from the growth seeds, as the connection wiring. Secure electric connection is finally provided between the wirings.

8 Claims, 6 Drawing Sheets

SEMICONDUCTOR DEVICE HAVING A MULTILAYERED WIRING STRUCTURE WITH DUMMY WIRING

This application is a continuation of application Ser. No. 08/030,619, filed Mar. 12, 1993, now abandoned.

BACKGROUND OF THE INVENTION

1. Field of the Invention

The present invention relates to a multi-layered wiring structure of a highly integrated semiconductor device, and a manufacturing method thereof.

2. Description of the Related Art

Remarkable developments have been made to high concentration and integration of a semiconductor device, such as an IC or an LSI, and as a result, a multi-layered structure is often used as a wiring structure for such a device. In this structure in which wirings are multi-layered, the area of the wirings is reduced to prevent the size of the chip from being enlarged, the length of the wirings is shortened thereby to restrain delays in the operation speed, which are caused by the resistance of the wirings, and arrangement of the wirings is automatized.

Figure 1A:
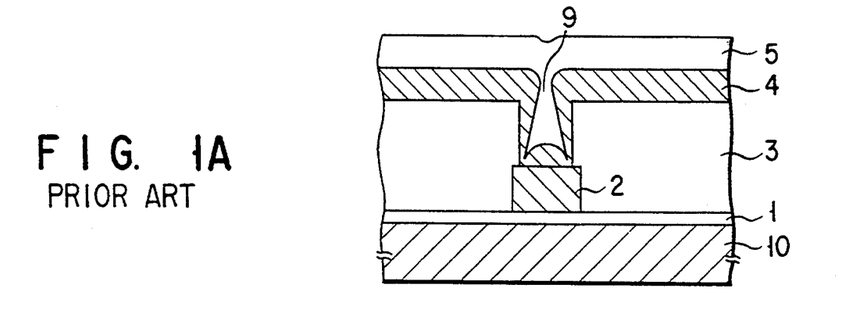
FIGS. 1A and 1B are cross sections showing a conventional semiconductor device.

In the following, the multi-layered wiring structure and the manufacturing method thereof, which are applied to a conventional semiconductor device will be explained with reference to a two-layered Al wiring structure cited as an example. FIG. 1 is a sectional view showing a multi-layered structure realized on a semiconductor substrate. A lower wiring 2 made of Al or the like is formed on a silicon semiconductor substrate 10, with an insulating film 1 made of $SiO_2$ or the like being inserted between the wiring and the substrate. The lower wiring 2 is covered with an insulating film 3 made of $SiO_2$ or other material. The surface of this insulating film may be flattened, if necessary, when upper wirings must further be formed on this insulating film. A conventional technique, such as a glass-flow method, an etch-back method, or the like, is used for flattening the film. Thereafter, a contact hole 9 is formed in the lower insulating film 3 by photolithography and etching. An Al film is then deposited on the lower insulating film 3 and in the contact hole 9, by a sputtering method or the like, and the Al film is subjected to patterning, thereby to form an upper wiring 4. Then, an upper insulating film 5 made of PSG or CVD $SiO_2$ is deposited on the wiring 4 (see FIG. 1A). In the case of a two-layered wiring structure, the upper insulating film 5 serves as a protective insulating film. If upper layers are deposited on the film 5, it serves as an inter-layer insulating film. In this case, a contact hole is further formed in the upper insulating film 5 on which a third wiring is formed. Fourth and fifth wirings may further be formed thereon, with insulating films being layered on respective wirings.

Another method may be as follows. A contact hole is formed in the lower insulating film 3, such that the lower wiring 2 is exposed to the contact hole. Then, tungsten which grows to be a connection wiring 7 is selectively grown in the contact hole, and then, an Al film is deposited on the lower insulating film 3, and is subjected to patterning, thereby to form an upper wiring 4. An upper insulating film 5 is made of CVF $SiO_2$ or the like is further provided on the upper wiring 4 (see FIG. 1B). In the case of forming further wirings thereon, a contact hole must be formed every time an inter-layer insulating film is additionally formed, and a connection wiring must also be deposited in the hole, as in the above example.

As the other conventional method in which a contact hole is formed, there is a method of electrically connecting a gate electrode and an upper wiring in the case where the lower wiring is a gate electrode (see Published Unexamined Japanese Patent Application No. 63-127551). In this method, contact hole is formed in one single step, for each layer and film, from the upper insulating film formed on the upper wiring to the gate electrode. In this contact hole, for example, a connection wiring is provided by selective growth of tungsten (W).

Figure 1B:
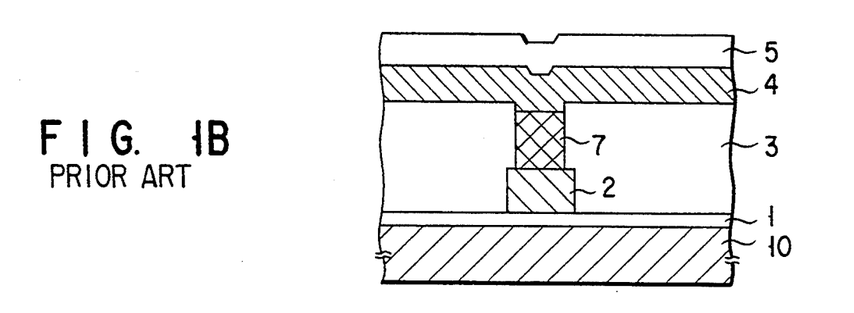
Figure 2A:
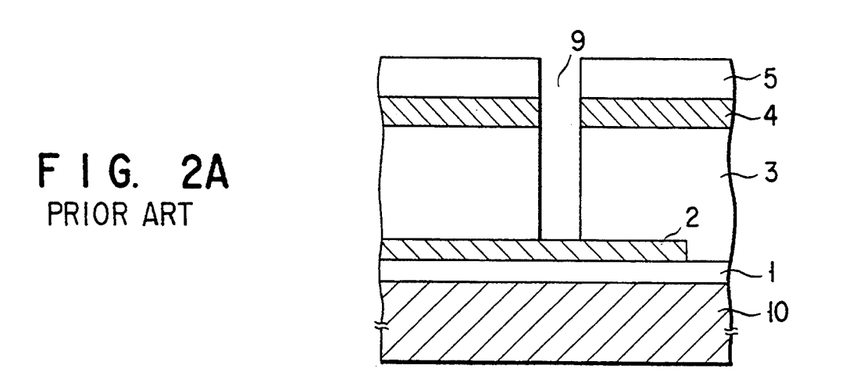
FIGS. 2A and 2B are cross sections showing a step of manufacturing a conventional semiconductor device.
Figure 2B:
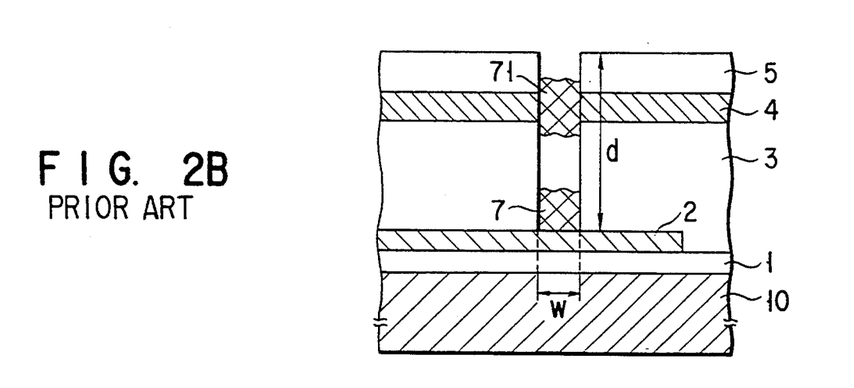

In a conventional multi-layered structure, connection between layers has been obtained by the methods stated above. However, for example, in the method of forming an upper wiring by a sputtering method after having formed a contact hole as shown in FIG. 1A, Al is not uniformly filled in the contact hole, and therefore, wirings may be disconnected. This method thus causes a problem of defective wiring. This problem appears more frequently when the diameter of the contact hole is reduced to be small, and when the number of layers constituting the multi-layered wiring structure is increased, i.e., when a so-called aspect ratio (depth d/width w) for the shape of the contact hole is increased. In addition, in the method of using a connection wiring formed by the selective growth as shown in FIG. 1B, the surface of tungsten must be processed with Ar ions, in order to achieve a good contact between Al and tungsten, when tungsten which constitutes a connection wiring in the contact hole is subjected to selective growth, and an Al film is then formed which serves as an upper wiring. In this case, a gate oxide film of a transistor which constitutes the semiconductor device may be broken due to irradiation of Ar ions. In another conventional method explained above, in which a contact hole is formed by one single step from the upper insulating to the gate oxide film, the upper and lower wirings are gradually connected as the selective growth of tungsten proceeds. This method therefore does not involve the above problem, but includes the following problem. This method is explained in FIG. 2 which is a partial sectional view showing the semiconductor substrate of a semiconductor device. When forming a contact hole 9, the upper insulating film 5, upper wiring 4, and the lower insulating film 3 are etched to expose the surface of the lower wiring 2. Connection wirings 7 and 71 made of tungsten are prepared by selective growth in the contact hole 9. In this step, the upper wiring 4 and lower wiring 2 both exposed to the contact hole 9 serve as growth seeds, and tungsten grows up therefrom. It is however impossible to apply this method to a semiconductor device in which the aspect ratio is increased to be 1 or more as a result of high integration. Specifically, since this method uses two bases, tungsten grows up to be a cap 71 when tungsten is subjected to rapid growth at the base of the upper wiring 4, while tungsten does not sufficiently grow up at the base of the lower wiring 2. As a result, the connection wirings 7 and 71 are formed separately, and a space remains between the two separate wirings formed.

Further, the conventional methods involves a problem that, every time any two of wirings are connected with each other, the inter-layer insulating film must be etched to form a contact hole, and therefore, manufacturing steps must be increased.

The present invention has as its object to provide a method of manufacturing a semiconductor device which is excellent in electric characteristics and is suitable for high integration, and to provide a semiconductor device having a multi-layered wiring structure which can easily be manufactured.

SUMMARY OF THE INVENTION

The present invention is characterized in that a dummy wiring is provided between wirings constituting a multi-layered wiring, when an electric connection is prepared between wirings disposed in the vertical direction.

The semiconductor device according to the present invention is characterized by comprising: a semiconductor substrate on which a multi-layered wiring is formed; a lower wiring constituting a part of the multi-layered wiring, formed on the semiconductor substrate; at least one lower insulating film formed over the semiconductor substrate such that the lower insulating film covers the lower wiring; an upper wiring constituting a part of the multi-layered wiring, formed on the lower insulating film; an upper insulating film formed over the semiconductor substrate such that the upper insulating film covers the upper wiring; a dummy wiring formed in the lower insulating film, situated between the upper wiring and a surface of the semiconductor substrate or between the upper wiring and the lower wiring; a connection wiring for electrically connecting the upper wiring with the surface of the semiconductor substrate or with the lower wiring, filling a contact hole which is formed through the upper insulating film, the upper wiring, the dummy wiring, and the lower insulating film, such that the surface of the semiconductor substrate or the lower wiring are exposed, and such that the upper wiring and the dummy wiring are exposed on a side wall of the contact hole. The dummy wiring may be electrically connected to the multi-layered wiring only through the connection wiring. The dummy wiring may consist of a plurality of wiring layers. At least one of the wiring layers constituting the dummy wiring may extend from a layer of the wirings constituting the multi-layered wiring layer. A bypass may be formed in one or each of the upper and lower wirings, and the contact hole may be formed in the bypass.

In addition, the method for manufacturing a semiconductor device, according to the present invention, is characterized by comprising: a step of forming a lower wiring on a semiconductor substrate; a step of forming a dummy wiring over the semiconductor substrate covered by the lower wiring, with an insulating film being inserted between the dummy wiring and the lower wiring; a step of forming an upper wiring over the semiconductor substrate covered by the dummy wiring, with an insulating film being inserted between the upper wiring and the dummy wiring; a step of forming an upper insulating film over the semiconductor substrate, such that the upper insulating film covers the upper wiring; a step of forming a contact hole surrounded by the upper insulating film, the upper wiring, the insulating film formed between the upper and lower wirings, the dummy wiring, and the lower wiring or a surface of the semiconductor substrate, by etching and exposing the upper insulating film, the upper wiring, the insulating film formed between the upper and lower wirings, and the dummy wiring in order; a step of forming a connection wiring under selective growth, for electrically connecting the upper wiring, the dummy wiring, and the lower wiring or the surface of the semiconductor device, on the upper wiring, the dummy wiring and the lower wiring or the surface of the semiconductor substrate, which are exposed to the hole.

The dummy wiring is exposed to the contact hole of the insulating film which is filled by the connection wiring. Therefore, the connection wiring serves as a growth seed in the contact hole, and tungsten begins selective growth from the growth seeds, like the upper and lower wirings exposed to the hole. Secure electric connection is finally provided between the wirings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

In the following, embodiments of the present invention will be explained with reference to the drawings.

Figure 3:
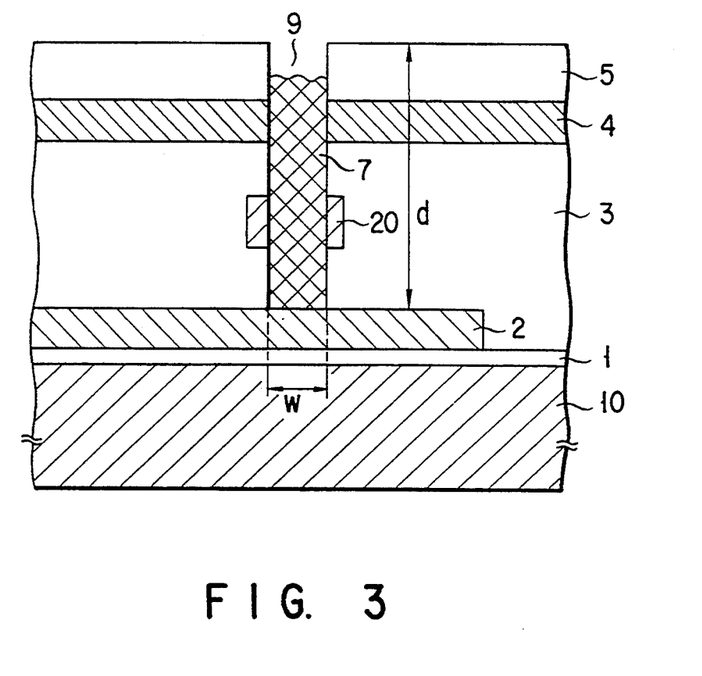
FIG. 3 is a cross section showing a semiconductor device according the first embodiment of the present invention.
Figure 4:
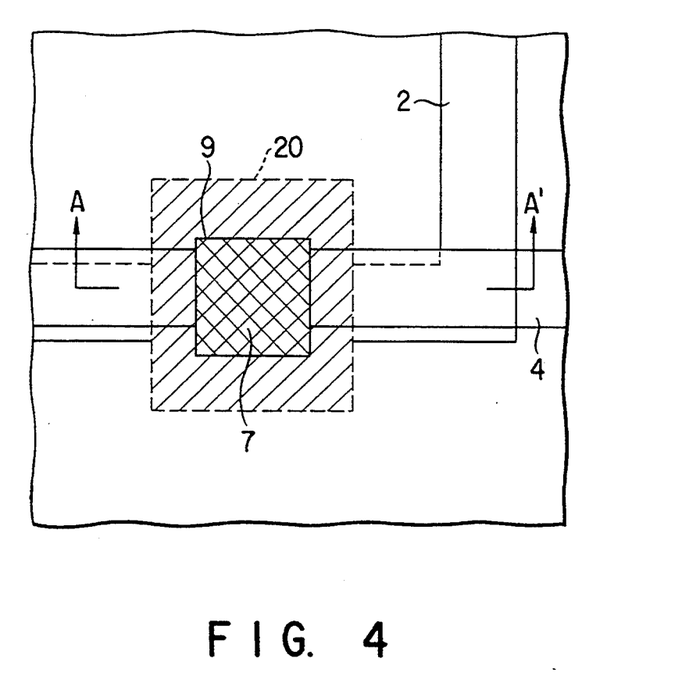
FIG. 4 is a plan view showing the semiconductor device of FIG. 3.
Figure 5:
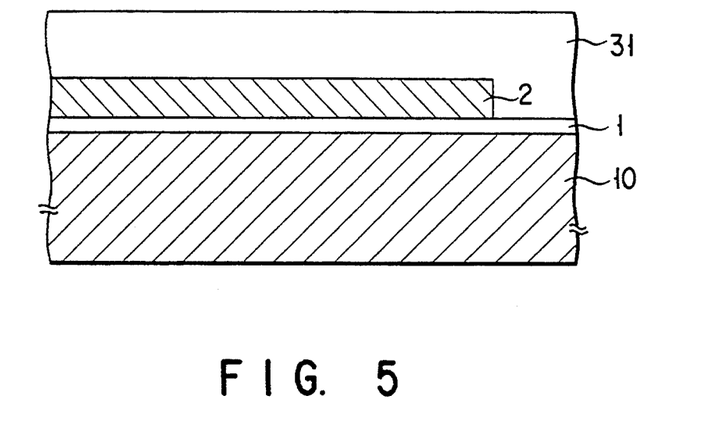
FIG. 5 is a cross section showing a step of manufacturing the semiconductor device according to the first embodiment of the present invention.
Figure 6:
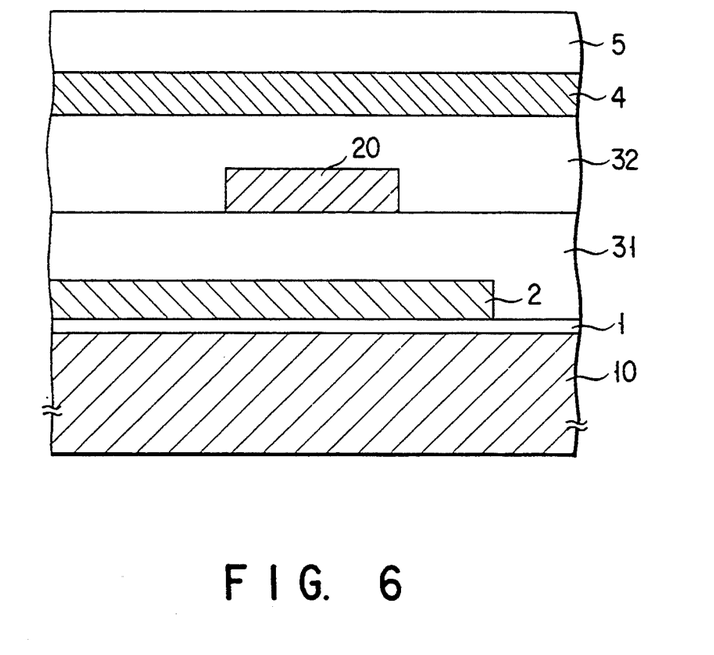
FIG. 6 is a cross section showing a step of manufacturing the semiconductor device according to the first embodiment of the present invention.
Figure 7:
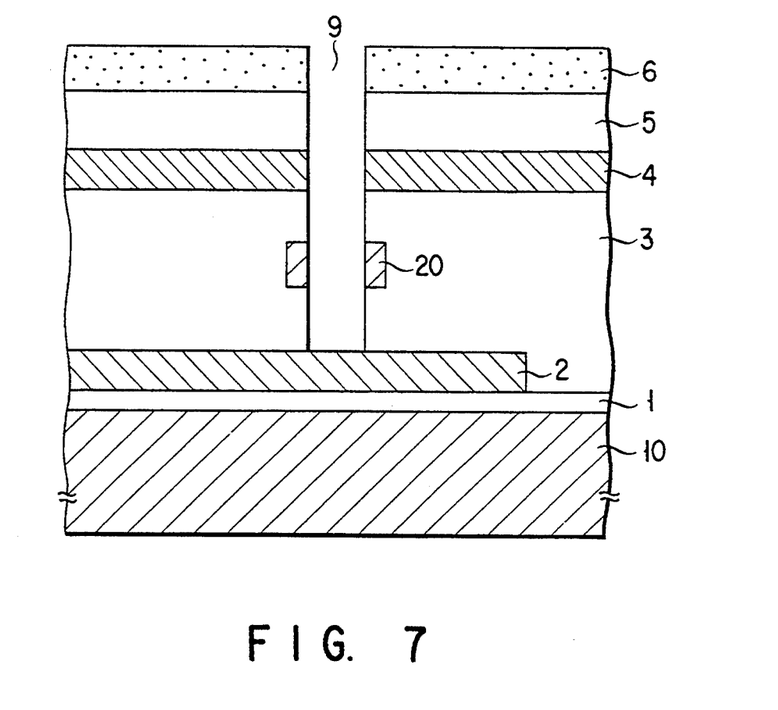
FIG. 7 is a cross section showing a step of manufacturing the semiconductor device according to the first embodiment of the present invention.

A first embodiment will now be explained with reference to FIGS. 3 to 7. FIG. 3 is an enlarged cross section showing a part of FIG. 4, cut along the line A—A', and shows the multi-layered structure of a semiconductor device. FIG. 4 is a plan view explaining the wirings of the structure. FIGS. 5 to 7 are cross sections showing the steps of manufacturing the semiconductor device. As a substrate of the device, a semiconductor substrate 10 is prepared which has an element region (not shown) where a MOS transistor or the like is formed. This substrate 10 is covered with an insulating film 1 made of, for example, $SiO_2$ by thermal processing. A lower wiring 2 made of Al or the like and having a predetermined wiring pattern is formed on the insulating film 1. A lower insulating film 3 made of, for example, CVD $SiO_2$ is formed over the semiconductor substrate 10, such that the insulating film 3 covers the lower wiring 2. The lower insulating film 3 consists of at least one layer of insulating film, and a dummy wiring 20 made of, for example, Al is provided in the one layer of insulating film. An upper wiring 4 made of, for example, Al and having a predetermined pattern is formed on the surface of the lower insulating film 3. This wiring 4 is covered and protected by an upper insulating film 5 made of, for example, CVD $SiO_2$. In this structure, a through contact hole 9 penetrating through the upper insulating film 5 to the lower wiring 2, thereby exposing the wiring 2. A connection wiring 7 made of metal having a high melting point, e.g., tungsten is filled in the hole, and electrically connects the upper wiring 4 with the lower wiring 2. The dummy wiring 20 does not have any other electric contacts with wiring, other than those made through by the connection wiring 7. Although the dummy wiring 20 is shaped like a quadrilateral or a rectangle in this embodiment, the dummy wiring 20 according to the present invention is not limited to these shapes.

The manufacturing method of the first embodiment will now be explained. For example, an insulating film 1 is formed on a P-type silicon semiconductor substrate 10, by thermal processing or the like. Thereafter, an Al film having a thickness of about 6000 Å is formed by sputtering or the like, and is then patterned to form a lower Al wiring 2 having a wiring width of about 1.2 μm. Further, an $SiO_2$ film is formed by a CVD method and is flattened to form an inter-layer insulating film 31 made of CVD $SiO_2$ on the lower wiring 2 (see FIG. 5). An Al film having a thickness of about 6000 Å is formed on the inter-layer insulating film 31, and is patterned to form a dummy wiring 20 having a wiring width of about 1.2 μm. Thereafter, an $SiO_2$ film is formed so as to cover the dummy wiring 20 by a CVD method, and is then flattened to form an inter-layer insulating film 32 made of CVD $SiO_2$ on the dummy wiring 20. An Al film having a thickness of about 6000 Å is formed on the inter-layer insulating film 32, and is patterned to form an upper Al wiring 4 having a wiring width of about 1.2 μm. Thereafter, an upper insulating film 5 is formed so as to cover the upper wiring 4 (see FIG. 6). Photo resist 6 is then applied onto the upper insulating film 5, and is subjected to patterning by photo-lithography. With the patterned photo-resist 6 being used as a mask, etching is performed on the surface of the upper insulating film 5 in the downward direction, by anisotropy etching such as RIE which mainly uses a $Cl_2$ gas or a $CHF_3$ gas, until the lower wiring 2 is exposed, thereby to form a contact hole 9 having edges each being approximately 1.5 μm long (see FIG. 7). As shown in the figure, the lower wiring 2, dummy wiring 20, and the upper wiring 4 are exposed on the side walls surface and the bottom of the contact hole 9. The exposed portions of the wirings serve as growth seeds.

After the photo-resist is then removed, tungsten is gradually grown from the growth seeds stated above under a gas pressure of about 0.2 torr for a growth period of 60 minutes, by a selective growth method using, for example, tungsten hexafluoride and a hydrogen gas, until a connection wiring 7 is finally formed in the contact hole 9 (see FIG. 3). The dummy wiring may have an arbitrary shape, and only a small portion thereof may be exposed to the contact hole, as far as the portion sufficiently serves as a growth seed. In addition, interlayer insulating films 31 and 32 constitute a lower insulating film 3.

Due to the presence of a dummy wiring, the connection wiring uniformly grows, and a cap 71 as shown in FIG. 2 is not formed in an upper portion of the hole, so that the wiring connection is realized with excellent electric contact. In addition, an electric connection may suitably be provided at a desired portion, if necessary, even after formation of wirings are completed. Two, three or more layers of dummy wirings may be provided, unlike the single dummy wiring shown in FIG. 3, and such prural wirings may be applied to a multi-layered wiring structure having an aspect ratio (d/W) of 5 or more.

Figure 8:
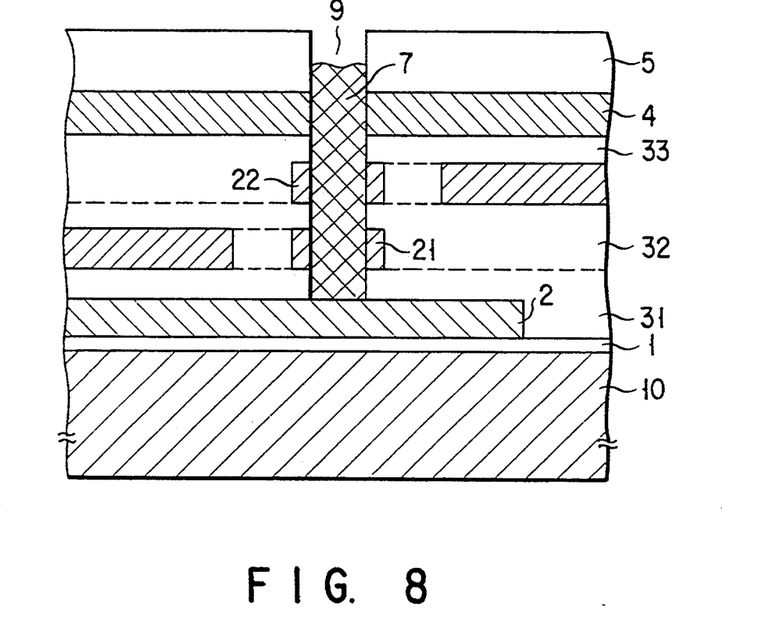
FIG. 8 is a cross section showing a semiconductor device according to the second embodiment of the present invention.

A second embodiment will now be explained with reference to FIG. 8. In the above embodiment, the dummy wiring is independent of other wirings, and is merely used as a growth base for selectively growing a connection wiring. The second embodiment is characterized in that the dummy wiring is constituted by a part of multi-layered wirings. A silicon semiconductor substrate 10 is covered by an insulating film 1 made of, for example, $SiO_2$. A lower wiring 2 made of, for example, Al, which has a predetermined wiring pattern is formed on the insulating film 1, and an inter-layer insulating film 31 made of, for example, CVD $SiO_2$ is formed so as to cover the lower wiring 2. A first dummy wiring 21 having a predetermined wiring pattern is formed on the interlayer insulating film 31. A second dummy wiring 22 having a predetermined wiring pattern is formed over the dummy wiring 21, with an inter-layer insulating film 32 being inserted between the second dummy wiring 22 and the dummy wiring 21. The second dummy wiring 22 is covered by an inter-layer insulating film 33 on which an upper wiring 4 having a predetermined wiring pattern and made of, for example, Al is formed. The upper wiring 4 is covered and protected by an upper insulating film 5 made of, for example, CVD $SiO_2$. In this structure, a contact hole 9 is formed so as to penetrate through the upper insulating film 5 to the lower wiring 2, such that the lower wiring 2 is exposed to the hole. Thus, at least parts of dummy wirings 21 and 22 are exposed in the wall of the contact hole 9. In this hole, a connection wiring 7 made of metal having a high melting point, such as tungsten or the like, is filled, electrically connecting the upper wiring 4, the second dummy wiring 22, the first dummy wiring 21, and the lower wiring 2. The dummy wiring does not only serve as a growth seed, but also forms a part of the multi-layered wirings. Specifically, if the lower wiring 2 is considered as the first-layered Al wiring of multi-layered wirings, a first dummy wiring is the second-layered Al wiring, a second dummy wiring is the third-layered Al wiring, and the upper wiring is the fourth-layered Al wiring. In this embodiment, four wirings of the multilayered wirings can easily be connected with each other in a single step of forming a contact hole.

Figure 9:
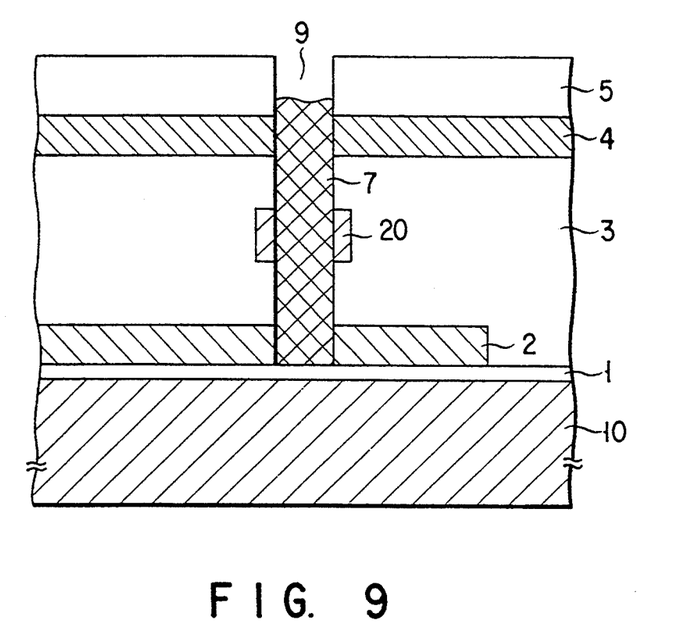
FIG. 9 is a cross section showing a semiconductor device according to the third embodiment of the present invention.

A third embodiment will now be explained with reference to FIG. 9. This embodiment is characterized by the structure of a lower wiring and the method of forming a contact hole. As a substrate, a silicon semiconductor substrate 10 is prepared which has an element region (not shown) where a MOS transistor or the like is formed. A lower wiring 2 having a predetermined wiring pattern, made of, for example, Al is formed on an insulating film 1 of the substrate 10. A lower insulating film 3 made of, for example, CVD $SiO_2$ is formed over the semiconductor substrate 10, such that the lower insulating film 3 covers the lower wiring 2. The lower insulating film 3 consists of at least one layer of insulating film, and a dummy wiring 20 made of, for example, Al is formed in this film 3. An upper wiring 4 having a predetermined wiring pattern, made of Al or the like, is formed on the surface of the lower insulating film 3. This upper wiring 3 is covered and protected by an upper insulating film 5 made of CVD $SiO_2$ or the like. In this structure, a contact hole 9 penetrating from the upper insulating film 5 to the lower wiring 2 is formed by anisotropy etching, such that the lower wiring 2 is exposed to the hole. In this step, the lower wiring 2 is also etched, thereby exposing the insulating film 1 provided under the wiring 2. If the lower wiring 2 is thus etched, this wiring has only a small area exposed to the contact hole 9. However, since the lower wiring may be partially removed by etching, as far as sufficient selective growth is obtained, techniques are not required for preventing over-etching. A connection wiring 7 made of metal having a high melting point is filled in the contact hole, and electrically connects the upper wiring 4 and the lower wiring 2.

Figure 10:
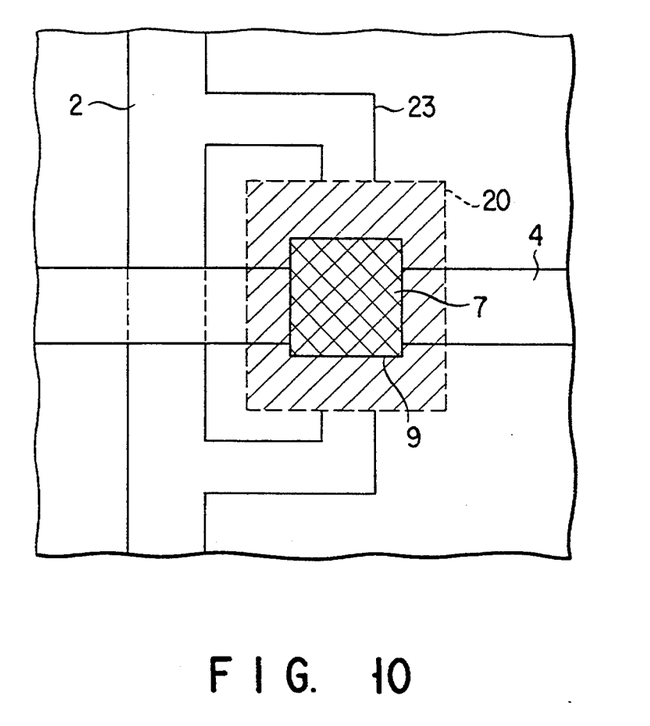
FIG. 10 is a cross section showing a semiconductor device according to the fourth embodiment of the present invention.

A fourth embodiment will now be explained with reference to FIG. 10. FIG. 10 is a plan view showing a semiconductor substrate. If a bypass is formed in one or each of the upper and lower wirings, the degree of freedom is increased which locates the position where a contact hole is to be formed. In the figure, a bypass 23 is formed in the lower wiring 2. A dummy wiring 20 and an upper wiring 4 are sequentially formed over the bypass, with an inter-layer insulating film being inserted between the bypass and the dummy wiring, and between the dummy wiring and the upper wiring. Thereafter, an upper insulating film 5 is formed, and a contact hole 9 is formed from the top of the upper insulating film 5 (see FIG. 7). Since the bypass can arbitrarily be formed within a margin portion over the semiconductor substrate, the degree of freedom can be increased when a semiconductor device is designed by using such a bypass.

Figure 11A:
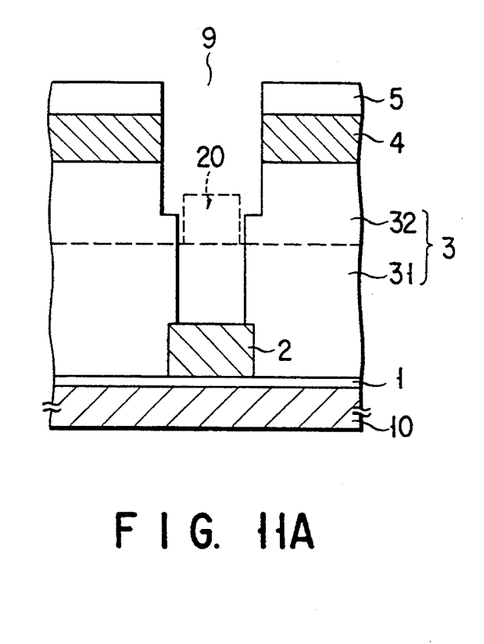
FIGS. 11A and 11B are cross sections showing a step of manufacturing a semiconductor device according to the present invention.
Figure 11B:
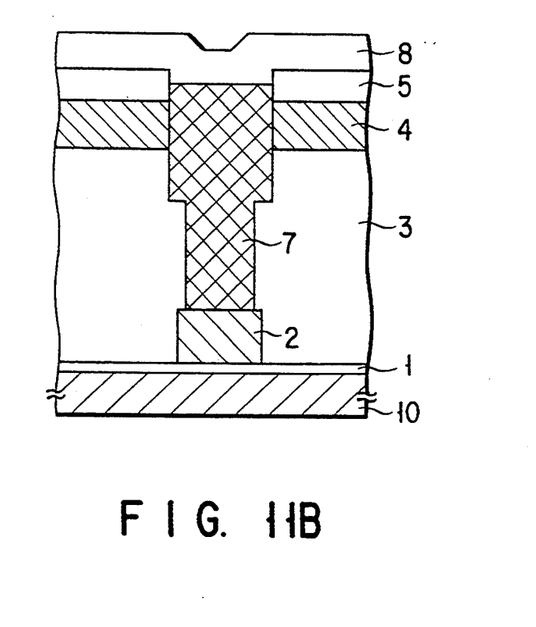
Figure 12:
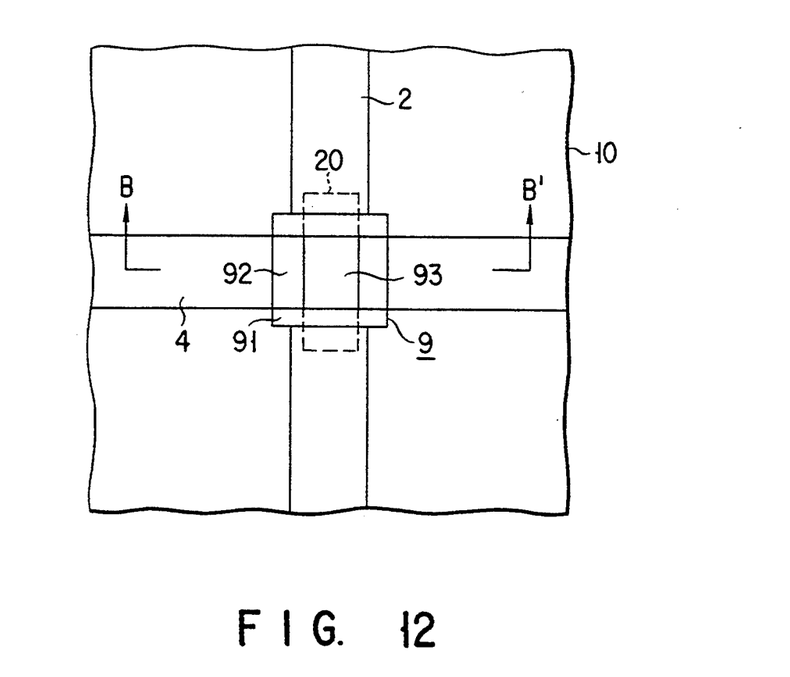
FIG. 12 is a plan view showing the semiconductor device of FIGS. 11A and 11B.

Another method of forming a connection wiring of a semiconductor device according to the present invention will now be explained with reference to FIGS. 11 and 12. FIG. 11 is an enlarged sectional view showing a part of a semiconductor substrate of the semiconductor device, cut along the line B—B' in FIG. 12. FIG. 12 schematically showing the plan view of the substrate. A silicon semiconductor substrate 10 on which integrated circuits and transistors are formed is covered with an insulating film 1 made of $SiO_2$ by thermal oxidation or the like. A lower Al wiring 2 is formed on the insulating film 1, for example, by a sputtering method. An inter-layer insulating film 31 made of CVD $SiO_2$ is deposited, covering the lower wiring 2. A dummy wiring 20 is then formed on the inter-layer insulating film 31, such that the dummy wiring 20 has a shape substantially like a quadrangle. Then, an inter-layer insulating film 32 of CVD $SiO_2$ is formed so as to cover the dummy wiring 20. Inter-layer insulating films 31 and 32 constitute a lower insulating film 3. An upper Al wiring 4 is formed on the lower insulating film 3, by sputtering or the like. The upper wiring 4 is formed such that, for example, it crosses the lower wiring at right angles. An upper insulating film 5 made of CVD $SiO_2$ is formed on the upper wiring 4. Photo-resist (not shown) is applied onto the insulating film 5, and is subjected to patterning, thereby to obtain a mask having a predetermined opening portion for etching the insulating film 5. Using the mask, the upper insulating film 5 is first etched by anisotropy etching, such as RIE mainly using a $CHF_3$ gas, and the etching continues until the half of the upper wiring 4 is exposed. Secondly, etching is performed by RIE mainly using a $Cl_2$ gas, from the exposed portion of the upper wiring 4, and continues until the portion of the upper wiring 4 is removed which corresponds to the predetermined opening portion. After the portion of the upper wiring 4 is removed within the predetermined opening portion, etching is continued by RIE mainly using a $CH_F 30$ gas, following the trace of the wiring 4 and attaining self-alignment, until the half of the dummy wiring 20 is exposed. After the half of the dummy wiring 20 is exposed, etching is started again from the portion where the wiring 20 is exposed, by RIE mainly using a $Cl_2$ gas, and is continued until the dummy wiring 20 is removed within the range of the predetermined opening portion. After the dummy wiring 20 is removed within the range of the predetermined opening portion, the inter-layer insulating films 31 and 32 are etched by RIE mainly using a $CHF_3$ gas, following the traces of the wiring 20 and the upper wiring 4 and attaining self-alignment, until the lower wiring 2 is exposed and a contact hole 9 is thereby formed. Thereafter, selective growth is performed to form a connection wiring 7 of tungsten, while the surfaces of the upper wiring 4, dummy wiring 20, and the lower wiring 2, which are exposed to the contact hole 9, are used as growth seeds. A protective insulating film 8 made of BPSG is finally formed covering the upper insulating film 5. When a contact hole is formed in the method as explained above, the contact hole finally has a small quadrangular cross section having sides each being about 1.2 $\mu m$ long, though the opening portion of the contact hole is shaped like a quadrangle having sides, for example, each being about 1.5 $\mu m$ long. Thus, the cross sectional area 91 is formed to be large by using a photo-mask, and the cross sectional area 92 is formed to be small in conformity with the upper wiring in the following etching, and the cross sectional area 93 is formed to be much smaller, in conformity with the size of the the dummy wiring. The above method is advantageous for fine processing of a semiconductor device.

Although aluminum is used as material of wirings in the above embodiments, the present invention is not limited to wirings made of aluminum. Polycrystal silicon, Cu, metal silicide having a high melting point, or a polycide film which is a composite film made of polycrystal silicon and silicide may be used as material of the wirings. In addition, barrier metal such as nitride or the like may be used as a ground coat for the Al film which serves as a wiring. The connection wiring is not limited to tungsten. Other metal having a high melting point, for example, Mo, Ti, or Ta may be used as material of the connection wiring. The present invention may be applied not only to a silicon semiconductor, but also to all known semiconductors using, for example, Ga, As, Ge or the like.

In the above embodiments, explanation has been made to a connection between any wirings constituting a multi-layered wiring structure. The present invention, however, may be applied to a connection between a gate electrode and a wiring or between a wiring and a desired region of a semiconductor substrate, such as, a source or drain region. Further, according to the present invention, a connection can easily and securely be attained between wirings which are apart from each other with several layers inserted therebetween.

In the structure as explained above, the manufacturing process for connecting multi-layered wirings of a semiconductor device is simplified even when four or more layered wirings are layered, since a contact hole in which a connection wiring for connecting multi-layered wirings is to be filled is formed in one single step after patterns of the multi-layered wirings are formed. In addition, a dummy wiring stabilizes Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor substrate on which a multi-layered wiring is formed;
   a lower wiring which comprises a part of the multi-layered wiring and is formed over the semiconductor substrate;
   at least one lower insulating film formed on the lower wiring;
   an upper wiring, which comprises a part of the multi-layered wiring, formed on the lower insulating film;
   an upper insulating film formed on the upper wiring;
   a dummy wiring formed in the lower insulating film, situated between the upper wiring and the lower wiring;
   a through hole penetrating through the upper insulating film, the upper wiring, the dummy wiring, and the lower insulating film, and formed such that the lower wiring is exposed, and such that the upper wiring and the dummy wiring are exposed on a side wall of the through hole; and
   a connection wiring filled in the through hole, for electrically connecting the upper wiring with the lower wiring.

2. A semiconductor device according to claim 1, wherein the dummy wiring is electrically connected to the multi-layered wiring only through the connection wiring.

3. A semiconductor device according to claim 1, wherein the dummy wiring comprises a plurality of wiring layers.

4. A semiconductor device according to claim 1, wherein at least one of the wiring layers constituting the dummy wiring may extend from a layer of the wirings constituting the multi-layered wiring layer.

5. A semiconductor device according to one of claims 1 to 3, wherein a bypass is formed in one of the upper and lower wirings, and the through hole is formed in the bypass.

6. A method of manufacturing a semiconductor device, characterized by comprising:
   a step of forming a lower wiring on a semiconductor substrate;
   a step of forming a dummy wiring over the semiconductor substrate covered by the lower wiring, with an insulating film being inserted between the dummy wiring and the lower wiring;
   a step of forming an upper wiring over the semiconductor substrate covered by the dummy wiring, with an insulating film being inserted between the upper wiring and the dummy wiring;
   a step of forming an upper insulating film over the semiconductor substrate, such that the upper insulating film covers the upper wiring;
   a step of forming a through hole surrounded by the upper insulating film, the upper wiring, the insulating film formed between the upper and lower wirings, the dummy wiring, and the lower wiring or a surface of the semiconductor substrate, by etching and exposing the upper insulating film, the upper wiring, the insulating film formed between the upper and lower wirings, and the dummy wiring in order; and
   a step of forming a connection wiring by selective growth, for electrically connecting the upper wiring, the dummy wiring, and the lower wiring or the surface of the semiconductor device, on the upper wiring, the dummy wiring and the lower wiring or the surface of the semiconductor substrate, which are exposed to the hole.

7. A semiconductor device comprising:
   a semiconductor substrate on which a multi-layered wiring is formed;
   a lower wiring which comprises a part of the multi-layered wiring and is formed over the semiconductor substrate;
   at least one lower insulating film formed on the lower wiring;
   an upper wiring which comprises a part of the multi-layered wiring, formed on the lower insulating film;
   an upper insulating film formed on the upper wiring;
   a dummy wiring formed in the lower insulating film, situated between the upper wiring and the lower wiring;
   a through hole penetrating through the upper insulating film, the upper wiring, the dummy wiring, the lower insulating film, and the lower wiring, and formed such that a substrate insulating surface covering the semiconductor substrate is exposed, and such that the upper wiring, the dummy wiring, and the lower wiring are exposed on a side wall of the through hole; and
   a connection wiring filled in the through hole, for electrically connecting the upper wiring with the lower wiring and the substrate insulating surface covering the semiconductor substrate.

8. A semiconductor device according to claim 7, wherein a bypass is formed in each of the upper and lower wirings, and the through hole is formed in the bypass.

* * * * *